United States Patent [19]
Strumolo et al.

[11] Patent Number: 6,088,521
[45] Date of Patent: Jul. 11, 2000

[54] METHOD AND SYSTEM FOR PROVIDING A VIRTUAL WIND TUNNEL

[75] Inventors: Gary Steven Strumolo, Beverly Hills; Viswanathan Babu, Farmington Hills, both of Mich.

[73] Assignee: Ford Global Technologies, Inc., Dearborn, Mich.

[21] Appl. No.: 09/072,347

[22] Filed: May 4, 1998

[51] Int. Cl.[7] ........................................ G06G 7/48
[52] U.S. Cl. ........................................ 395/500.29
[58] Field of Search .................................. 395/500.29

[56] References Cited

U.S. PATENT DOCUMENTS

| | | |
|---|---|---|
| 5,432,718 | 7/1995 | Molvig et al. . |
| 5,568,404 | 10/1996 | Strumolo . |
| 5,649,064 | 7/1997 | Jorgensen et al. . |
| 5,877,968 | 3/1999 | Strunolo et al. .................... 395/500.29 |

*Primary Examiner*—Kevin J. Teska
*Assistant Examiner*—Hugh Jones
*Attorney, Agent, or Firm*—David B. Kelley

[57] ABSTRACT

The present invention provides a method and system which allows evaluation of vehicle designs both aerodynamically and aeroaccoustically in a virtual environment. Starting with a computer aided design (CAD) description of the vehicle, a CFD simulation can be constructed and executed. This information can be used to provide an estimate of interior sound due to wind noise, which can then be played through speakers for A-to-B comparisons of alternate vehicle designs. The method generates predicted wind noise within a passenger compartment of an automotive vehicle from a computer aided design (CAD) model representative of the vehicle without use of a physical wind tunnel. A CAD model of a desired portion of the vehicle is prepared and a computational mesh of the desired portion of the vehicle design is created from the CAD model. A transient flow over the desired portion of the vehicle is then computed using the computational mesh, and a set of aerodynamic data from at least one predetermined area of the desired portion of the CAD model from the transient flow is extracted from the transient flow. A virtual representation of wind noise at a predetermined location with respect to the CAD model based upon the set of aerodynamic data is then generated, and an acoustic representation of the virtual representation of wind noise is produced.

19 Claims, 10 Drawing Sheets

METHOD AND SYSTEM FOR PROVIDING A VIRTUAL WIND TUNNEL

FIELD OF THE INVENTION

The present invention relates to automotive vehicle design in general, and more specifically to computer aided vehicle design.

BACKGROUND OF THE INVENTION

Automotive vehicle designers typically rely on wind tunnel tests for determining the aerodynamic characteristics and consequences of a vehicle design. A common approach is to place a prototype vehicle into a wind tunnel and conduct various tests, for example measuring drag and lift forces over the entire vehicle, or probing the flowfield using smoke injector probes. These tests require significant time, effort and expense. Since several design iterations are usually required before a final vehicle design is achieved, additional wind tunnel tests are needed, thus resulting in multiplication of test expense. Vehicle designers have thus looked for the day when computer related methods could be used to not only supplement wind tunnel tests, but to partially replace physical testing, to reduce vehicle development time and expense.

Heretofore, limitations on computer speed and algorithm accuracy have inhibited the development of a virtual wind tunnel, in which some, or all, of the aforementioned tests can be conducted via computer with a given vehicle design. However, with the advent of new and improved computational fluid dynamics (CFD) technology, which may for example incorporate the principles of lattice gas theory to predict fluid motion, a virtual wind tunnel is technically possible. A further need exists, nonetheless, for a method and system which utilizes available computer related technology to provide a user accessible virtual wind tunnel. Additionally, a method and system is needed to provide a comparison between test results from a physical wind tunnel and a virtual wind tunnel, and between alternate vehicle designs.

SUMMARY OF THE INVENTION

The present invention provides a method and system which allows evaluation of vehicle designs both aerodynamically and aeroaccoustically in a virtual environment. Starting with a computer aided design (CAD) description of the vehicle, a CFD simulation can be constructed and executed. This information can be used to provide an estimate of interior sound due to wind noise, which can then be played through speakers for A-to-B comparisons of alternate vehicle designs. The method generates predicted wind noise within a passenger compartment of an automotive vehicle from a computer aided design (CAD) model representative of the vehicle without use of a physical wind tunnel. A CAD model of a desired portion of the vehicle is prepared and a computational mesh of the desired portion of the vehicle design is created from the CAD model. A transient flow over the desired portion of the vehicle is then computed using the computational mesh, and a set of aerodynamic data from at least one predetermined area of the desired portion of the CAD model from the transient flow is extracted from the transient flow. A virtual representation of wind noise at a predetermined location with respect to the CAD model based upon the set of aerodynamic data is then generated, and an acoustic representation of the virtual representation of wind noise is produced.

An advantage of the present invention is a method and system which provides a user accessible virtual wind tunnel.

Another advantage is a method and system which allows aeroacoustic analysis of vehicle designs before expending time and resources to make a prototype vehicle.

Still another advantage of the present invention is a method and system which provides a comparison between test results from a physical wind tunnel and a virtual wind tunnel, and between alternate vehicle designs.

BRIEF DESCRIPTION OF THE DRAWINGS

These and other objects, advantages, and features of the present invention will be apparent to those skilled in the art upon reading the following description with reference to the accompanying drawings, in which.

DETAILED DESCRIPTION OF THE PREFERRED EMBODIMENT

Figure 1:
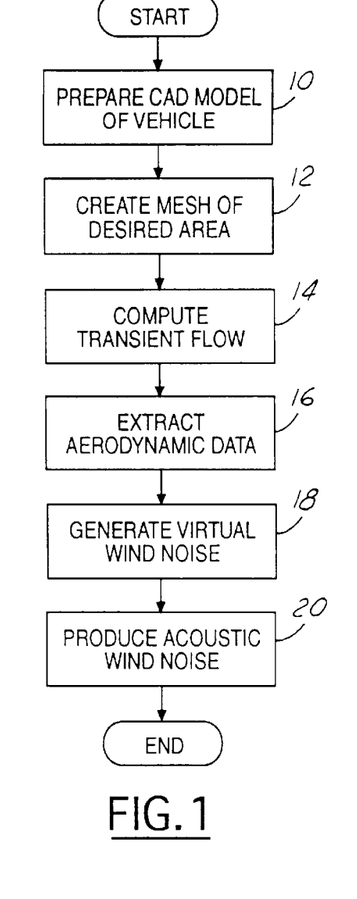
FIG. 1 is a flowchart of a method for generating predicted wind noise within a passenger compartment of an automotive vehicle from a computer aided design (CAD) model representative of the vehicle without use of a wind tunnel according to a preferred embodiment of the present invention.
Figure 2:
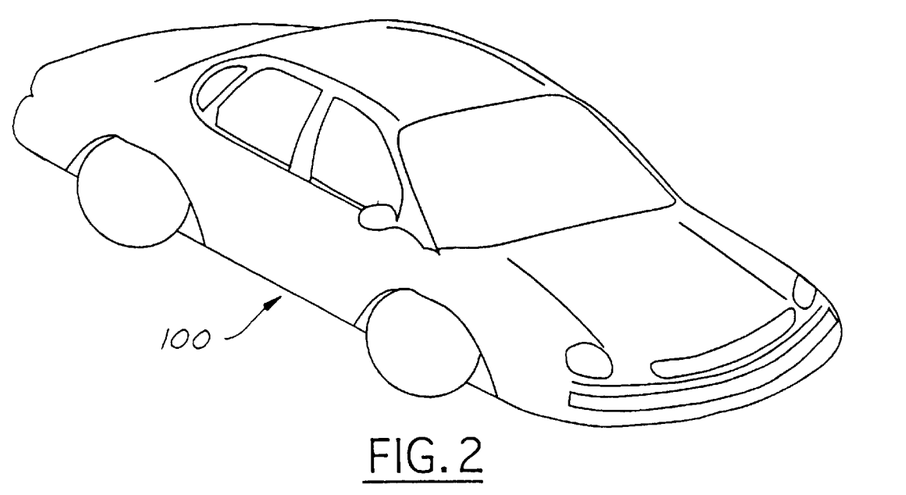
FIG. 2 is a perspective view of a CAD model of a vehicle.

Turning now to the drawings, and in particular to FIG. 1 thereof, a flowchart illustrating a preferred embodiment of a method of the present invention is shown. An implicit assumption made in conducting real wind tunnel testing is that the vehicles to be tested have already been built. In the present invention, a "virtual vehicle" in the form of a CAD model is required. In box 10 of FIG. 1, a CAD rendition of a vehicle surface model 100 (FIG. 2) is prepared. As those skilled in the art will appreciate, the information to develop the model is typically obtained from a vehicle body design team, but information from other sources, including the design teams for various components, such as wipers, may also be used. In a preferred embodiment of the present invention, the CAD model is displayed and revised, as further described below, to provide a completely closed solid vehicle model which is required for computational fluid dynamics.

Figure 3:
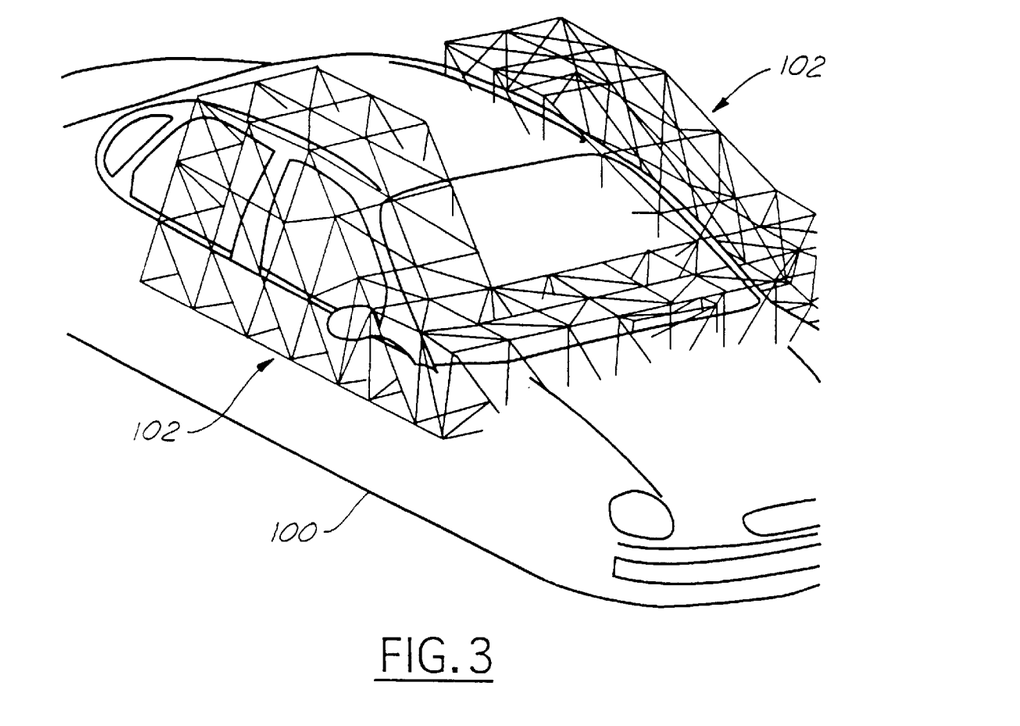
FIG. 3 is a perspective view similar to FIG. 2 but showing a computational mesh around selected portions of the CAD model.
Figure 4:
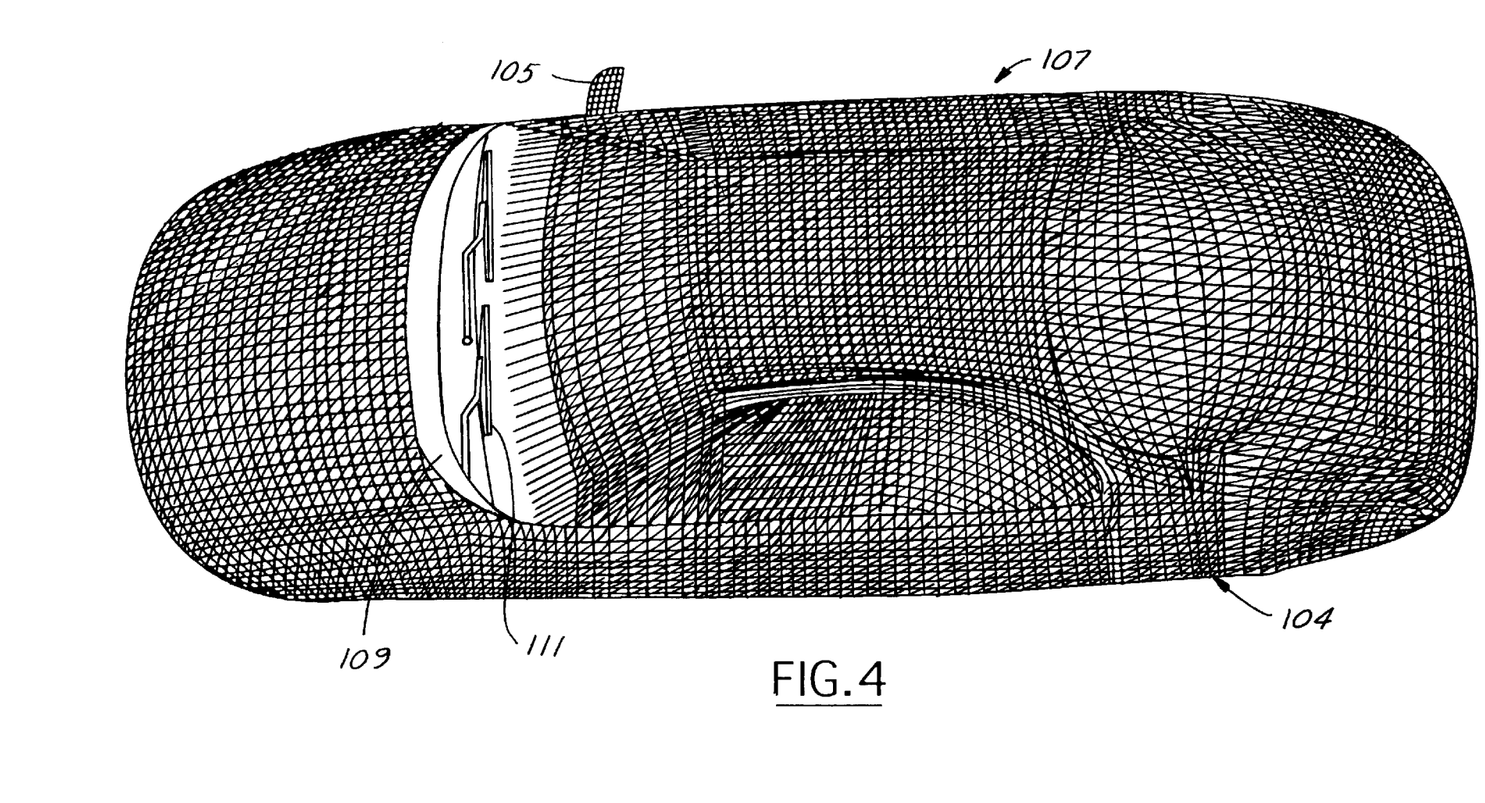
FIG. 4 is top view of a CAD model of a vehicle shown in a computational mesh over the entire model.
Figure 5:
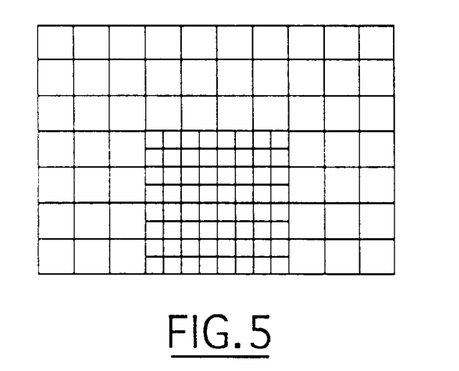
FIG. 5 is view of a refinement region of a computational mesh.

After the model 100 is prepared, it is fed into a computer program (FIG. 1, box 12) which creates a computational mesh 102 (FIG. 3). As will be recognized by those skilled in the art, a computational mesh is a tool used for various engineering and scientific studies, such as computational fluid dynamics and finite element analysis. Several commercially available programs exist for preparing a computational mesh, such as ANSYS FEA™ triangular surface mesh, generated by Hypermesh™, and STL™, generated by IDEAS™. As seen in FIG. 3, the computational mesh 102 may be needed only for a portion of the model 100, but can also be created for the entire model (FIG. 4). In FIG. 4, a meshed CAD model 104 for a vehicle design is shown. There is a side mirror 105 on a passenger side 107 only to determine it's impact on side glass pressures. A leaf screen 109 and driver's side windshield wiper 111 are included. The model may have over 60,000 triangular elements. Vehicle model preparation may become the most time consuming part of the present invention. In addition, once a mesh 102 is created, areas of particular interest may be refined in various ways. For example, in a Cartesian coordinate based computational mesh, refinements may be made in a series of nested regions by halving the linear dimension of grid cells, as illustrated in FIG. 5.

Figure 6:
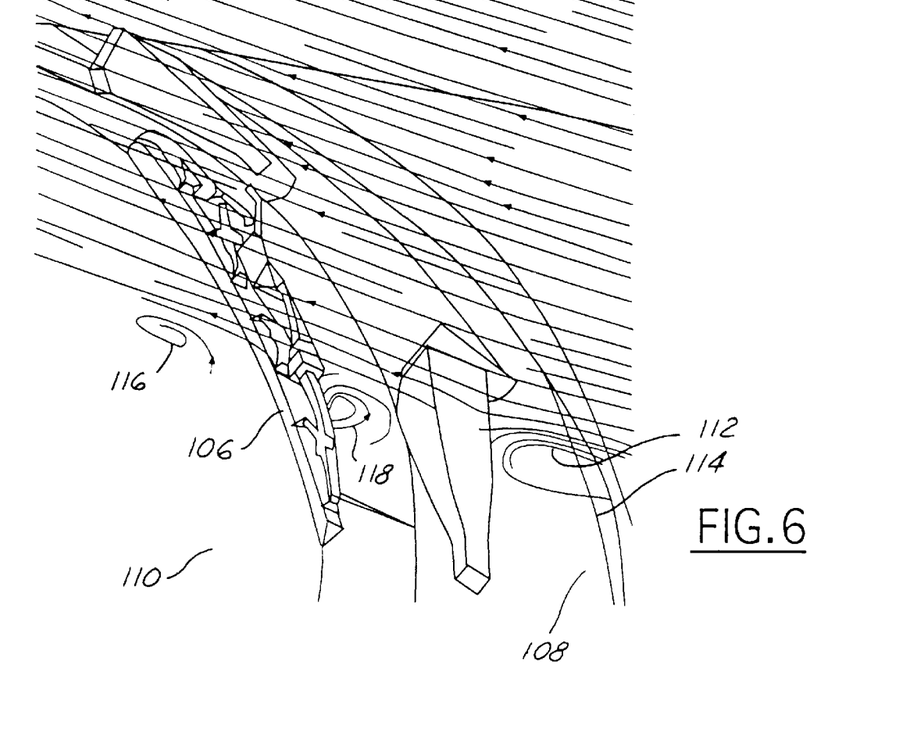
FIGS. 6 and 7 are perspective views of a cowl portion of a vehicle model showing flow lines which can be produced according to the present invention.
Figure 7:
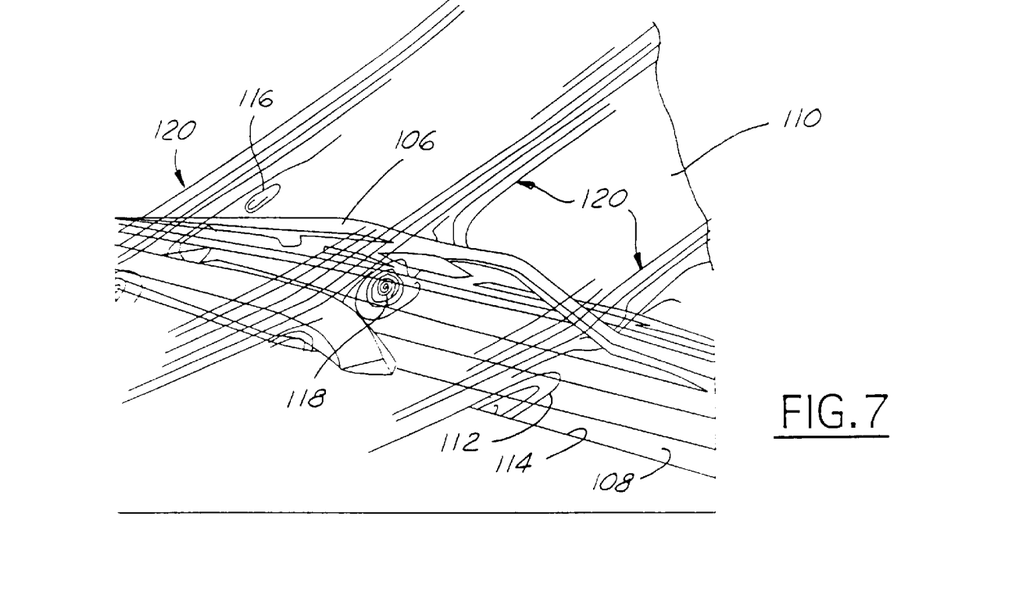

Next, a transient flow over the model 100 surface is computed (box 14 of FIG. 1). The transient flow computation can be performed by various existing programs, such as Exa™ by Digital Physics™. The flow can be illustrated, as shown in FIGS. 6 and 7, to permit visual inspection of various patterns. Preferably, the flow is averaged over a suitable time interval to yield a pseudo-steady-state. Aerodynamic data regarding flow patterns, forces, velocities and pressures are next obtained (box 16, FIG. 1). This data may include flow detail over the side glass of the model 100, for example A-pillar vortex location and strength, mirror wake details, and a pressure coefficient distribution. The data may be displayed in a predetermined format, for example on a video display terminal, to allow inspection and manipulation. This aerodynamic information, in turn, is used to predict the interior sound pressure level at the driver's ear due to wind noise (box 18, FIG. 1). The prediction of interior spectral sound level can be made using a wind noise modeling program, such as that disclosed in U.S. Pat. No. 5,568,404 (Strumolo), assigned to the assignee of the present invention and incorporated herein by reference. Finally, the spectral information is used to shape a white noise sound file and generate a representation of the wind noise (box 20, FIG. 1), which can be played through stereo speakers. The time for the entire process, from generating an acceptable CAD surface to hearing the wind noise sound, may require as little as 2–3 days, which is much less than the time currently required for conventional physical tunnel wind testing.

Processing of the CAD model is preferably done before computational fluid dynamics analysis so as to generate a completely closed solid representation of the vehicle, perhaps from a collection of surfaces. Such processing includes displaying the mesh in various formats, including points, which displays only the vertices, wireframe, which connects the points into a wireframe of unfilled triangles, and polygons, which displays filled triangles. Any unmatched edges can also be displayed by turning on the display of unmatched edges. Display of unmatched edges in the CAD model assists in locating and fixing these edges to provide a valid model geometry. The edges are located directly on screen since the program colors the problem areas in red. This is then easily fixed by a user and the revised CAD surface is further processed. Without the unmatched edge location feature of the present invention, a user would have to visually inspect the whole mesh, which may consist of over 60,000 triangles. In the present invention, a considerable amount of time is thus saved by the automatic unmatched edge location feature.

Figure 8:
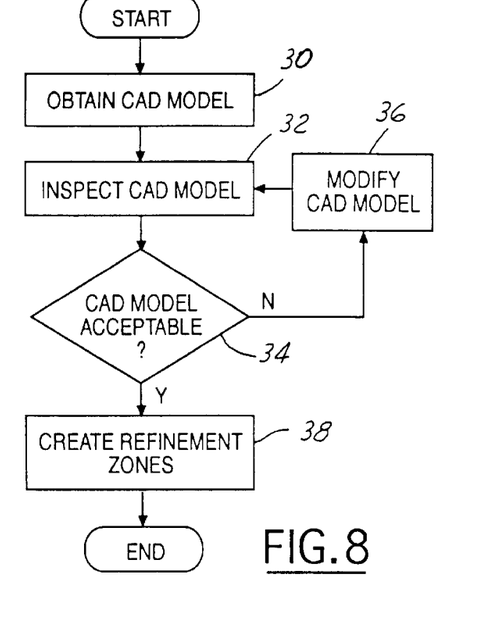
FIG. 8 is a flowchart of a CAD model modification method of the present invention used to prepare a model for computational flow dynamics.

As seen in the flowchart of FIG. 8, the CAD model is obtained in box 30. The model is then inspected in box 32 as described above, and if it is not acceptable (diamond 34), it is modified in box 36. The modification can include matching of unmatched edges, filling holes, and other mesh manipulation to ensure that the CAD model has a completely solid topology.

After an acceptable CAD model is obtained in decision diamond 34, areas of particular interest for wind tunnel study, such as described below, may be highlighted by designating refinement zones (box 38, FIG. 8). These zones are actually nested mesh boxes with the outermost box having the coarsest mesh spacing, $\frac{1}{60}$ of the height of the vehicle, and the innermost box having a finer spacing. All of these boxes completely surround the vehicle. In actual runs, further refinement zones in flow regions of special interest are created such as around the mirrors, wipers, backlight and the deck lid area. Typically, to resolve the flow structure around the wipers, geometry considerations alone dictate a mesh spacing of about $\frac{1}{480}$th of the height of the car. For aeroacoustic calculations, similar mesh spacings are required around the mirror and on the side glass. Such zones are user created by sketching them into the CAD model. Alternatively, the program for variably refining the mesh can be used, as described below.

Figure 9:
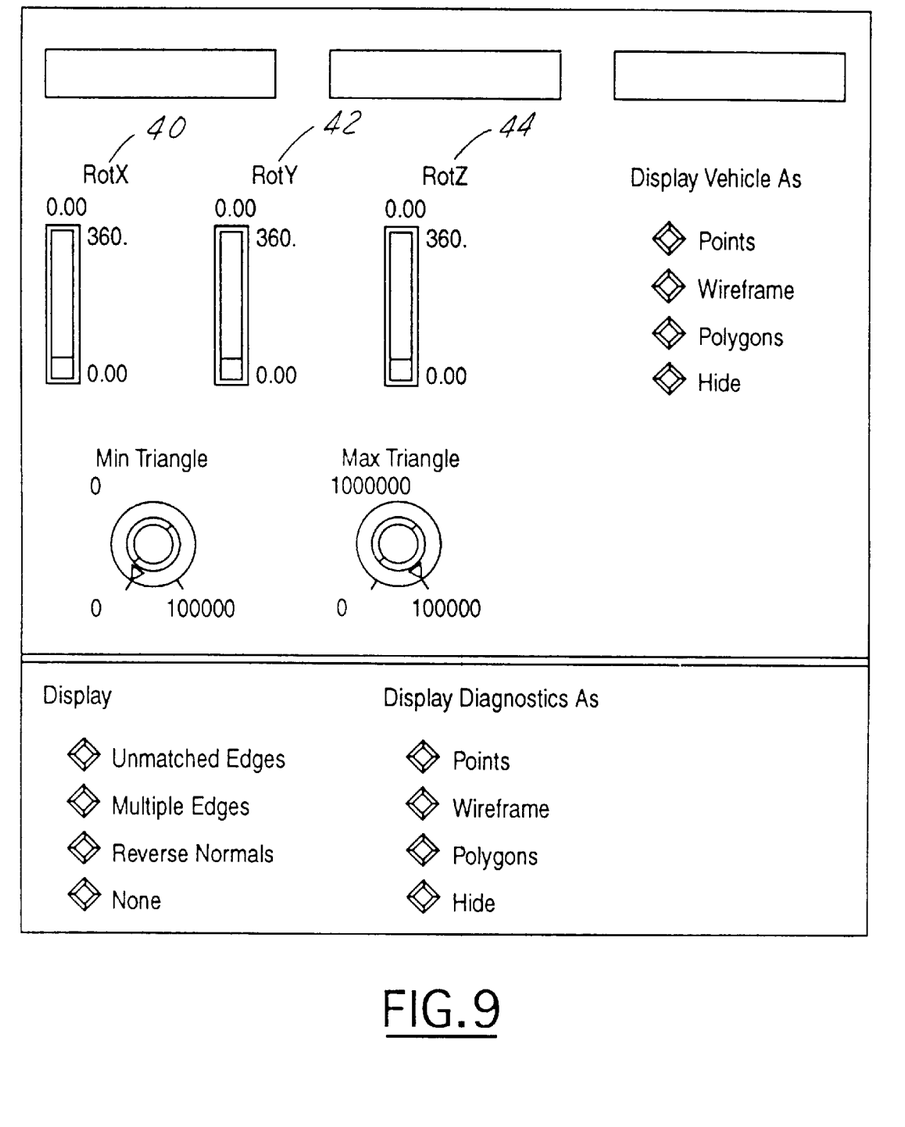
FIGS. 9 and 10 are screen views showing CAD model manipulation widgets available as part of the CAD model modification tool of the present invention.
Figure 10:
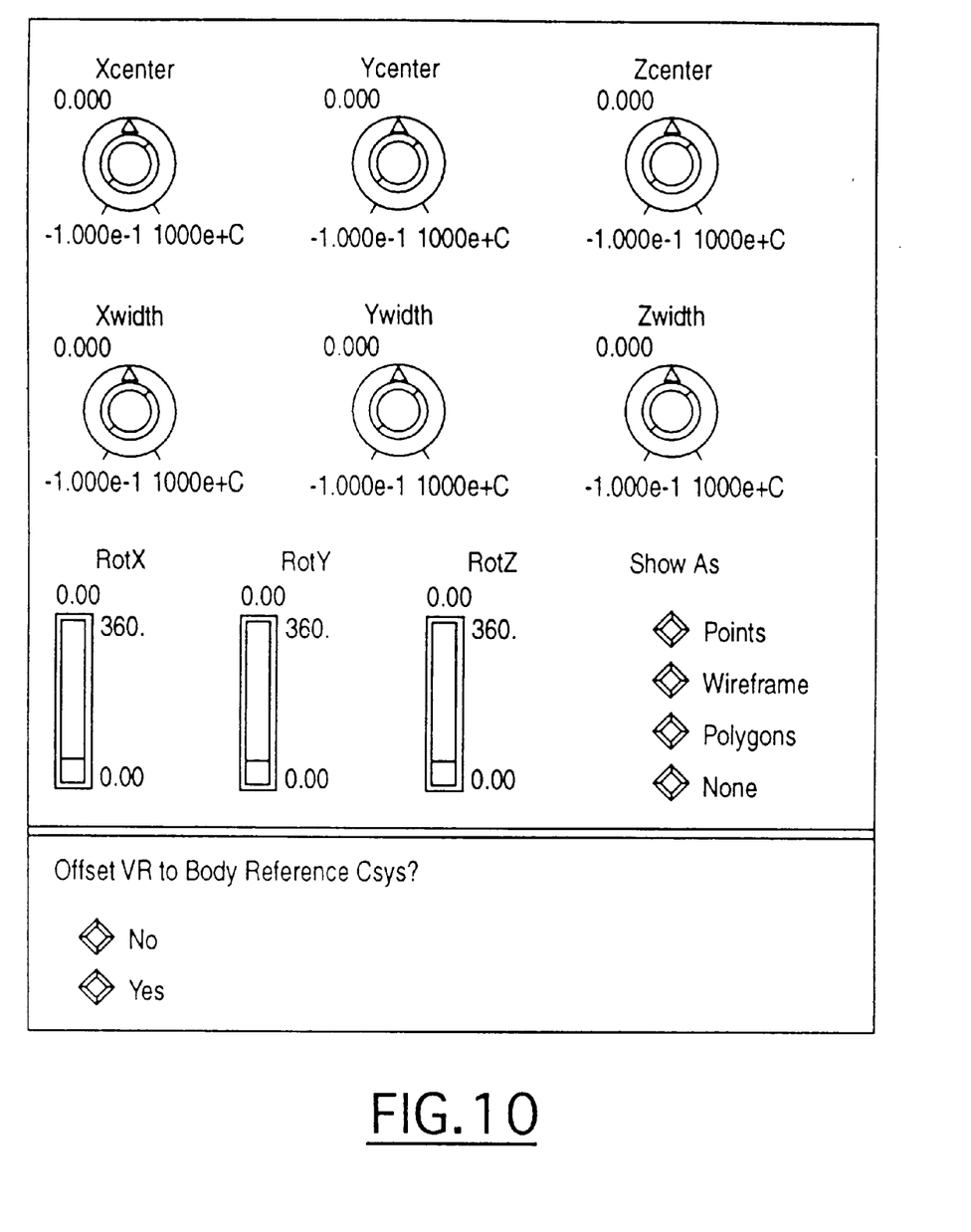

The CAD model can be three-dimensionally manipulated by rotation of coordinate axes. Any rotation of the coordinate axes of the finite element data necessary to bring it to the Body Reference coordinate system can be done by using the XRotation, YRotation and the ZRotation slider widgets 40, 42, 44, respectively (FIG. 9). The data can also be cropped using the dial widgets for displaying cut-away views of the solid. In FIG. 10, a screen allows the user to create and display a rectangular box of user-specified dimensions, orientation and color through the dials and sliders. These widgets can also used for measurment purposes. The program auomatically computes a correct X-coordinate offset between CAD and vehicle body reference systems, if necessary. If the geometry is symmetrical about the centerline, then the Z-coordinate offset is also calculated correctly. If the geometry is not symmetric, say, due to the presence of mirror only on one side, then the user can dial in the desired offset into the lateral_offset widget. If the geometry has a smooth underbody without any wheels, then no ground clearance need be input. If wheels are present then the ground clearance can be measured, again, by shaping the rectangular box appropriately and this value can then be dialed in through a ground clearance widget (not shown). Use of the methodology of FIG. 8 will help to eliminate the iterations required to successfully integrate a CAD vehicle geometry into the virtual wind tunnel of the present invention Various refinement zones of a mesh can be specified. For example, FIG. 3 illustrates a "120" region, which is a "U" shaped volume 102 that encloses the front side glass and mirror on both sides of the car, as well as the cowl area. The number "120" refers to the resolution level, i.e., grid spacing which is $1/120^{th}$ of the vehicle height. Other nested refinements (not shown) can be constructed, for example a region surrounding the wiper blade, which may be a "480" region with a mesh scale of $1/480^{th}$ of vehicle height. This level may be required to capture the details of the wiper assembly.

FIG. 6 shows a wiper region, detailing a wiper blade 106 and a leaf screen cavity 108. The wiper assembly shape reflects the fact that it is slightly compressed under tension, and that the blade 106 is in contact with the windshield 110 and follows it's curvature. The blade 106 is a triangular element that points normal to the windshield surface. The leaf screen cavity 108 retains all of the detail on an actual vehicle except for the air intake vents.

Various studies may be performed with the virtual wind tunnel of the present invention. In some vehicles, wiper fluid builds up below the driver's side wiper, moves along it to the ends of the blade, and then proceeds up the windshield in two streak lines. This occurs because the wipers are in the flow stream and recirculation regions form around them. To enhance wiper design, it is of interest, then, to use the virtual wind tunnel of the present invention to capture this phenomenon.

FIGS. 6 and 7 illustrate how air flows around the wiper assembly along vertical slices through both wipers. There are three recirculation regions. The first recirculation zone 112 lies in the leaf screen cavity 108 and is set up as air flows over the hood lip 114. The remaining two regions 116, 118 are positioned above and below the blade 106, respectively. There are streamlines 120 passing through various parts of the assembly, weaving their way in and around the arms and springs (FIG. 7).

Figure 11:
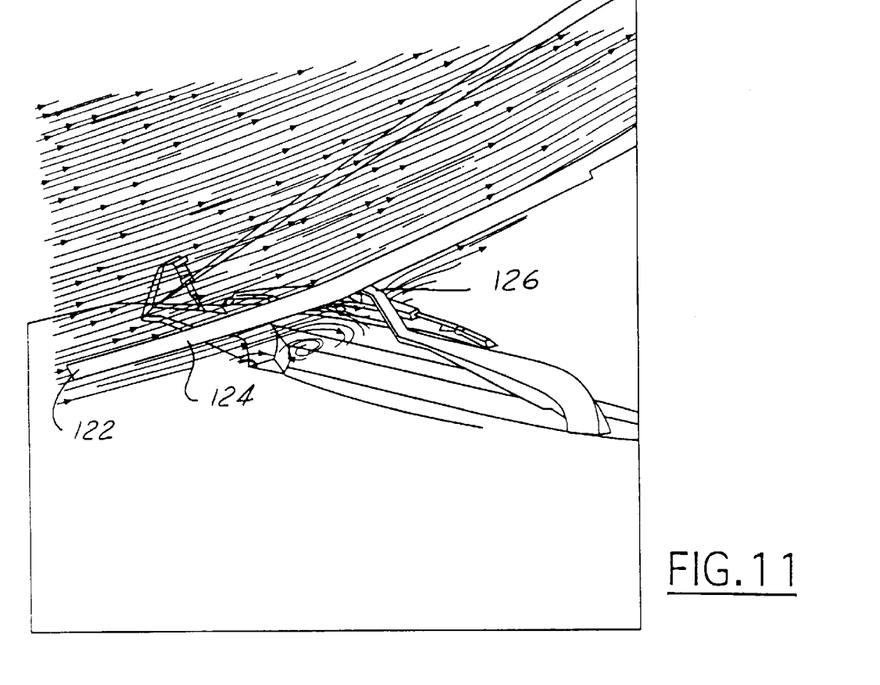
FIGS. 11 and 12 are perspective views of portions of a CAD model showing flow lines over area of interest in a vehicle design.

FIG. 11 illustrates an advantage the virtual wind tunnel of the present invention has over physical experiments. We begin by placing a small rectangular streamline rake 122 upstream of the wiper assembly. The resultant tubular streamline pattern 124 closely resembles what you would see if you placed a smoke injection nozzle at this location in an actual wind tunnel test. With smoke, the outline features of the flow are represented but detailed information is, practically speaking, impossible to obtain. Also, the smoke, while tightly collimated at the injector nozzle, tends to diffuse quickly in the flow, particularly if it hits an obstruction. With the virtual wind tunnel, however, we can construct a slice through the wiper at a location 126 where the "smoke stream" crosses it to clearly reveal details of the recirculation zones. This wiper fluid situation might be improved by adjusting the lip of the hood in the cowl area so that the air stream flows over the wipers, allowing water to fall down from the blades, rather than up the windshield. Alternate hood/wiper designs can be considered and evaluated using the virtual wind tunnel.

Figure 12:
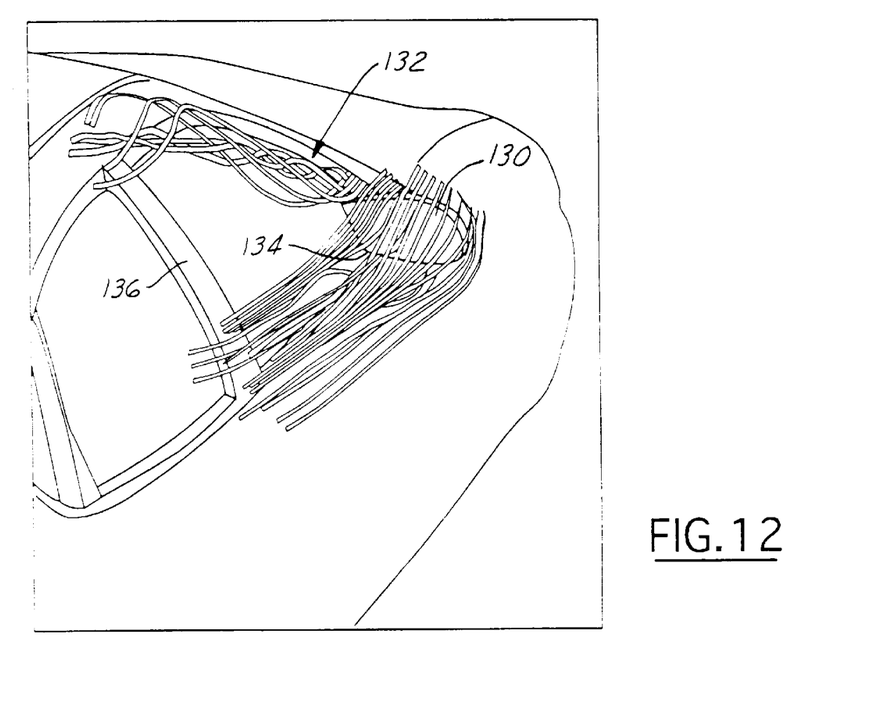

Turning now to another advantageous feature of the present invention, pressure distributions at desired locations on the vehicle surface can be modeled. To illustrate pressure distributions on the side glass flow structure, a streamline rake was placed in front of the side mirror 130 (FIG. 12). It shows the formation of an A-pillar vortex 132 as well as a separation bubble 134 behind the mirror. A vertical slice through the vehicle just before the B-pillar 136 further illustrates the vortex rollup.

A wind noise modeling program as mentioned above, for example U.S. Pat. No. 5,568,404, predicts sound pressure levels at the driver's ear due to wind noise. It does this by using steady-state CFD data on window surfaces. Such a program requires specification of the areas of three flow regimes on the glass surface: under the A-pillar vortex, under the side mirror wake, and the remaining reattached flow region, along with the average pressure coefficient in these regions. Previously, these values were obtained by visually inspecting a color picture of the pressure distribution and estimating, often by eye, the areas and pressures. Visual inspection may be too crude an estimate for certain wind tunnel tests, since such inspection could vary from person to person.

Figure 13:
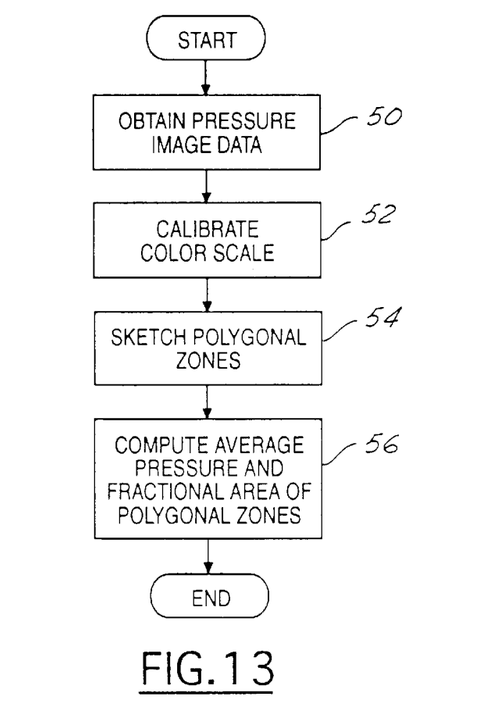
FIG. 13 is a flowchart of a flow dynamics parameter extraction method of the present invention used to extract predetermined data from a computational flow dynamics program for use with the present invention.

The present invention provides a method for more accurately estimating areas and pressure coefficients needed for input to a wind noise modeler. As seen in the flowchart of FIG. 13, a color image of pressure data for a desired location on a vehicle model is obtained in box 50. Such an image is typically available from a CFD program, for example after box 14 of FIG. 1. After an image is obtained, a color scale is calibrated (box 52, FIG. 13), for example in the form of a color bar legend quantifying the data. This step may comprise assigning specific pressures to predetermined colors on the color bar legend. Next, a user sketches on-screen any number of polygonal areas (box 54), for example under the A-pillar vortex, under the side mirror wake, and the remaining reattached flow region. The program will then output the total number of pixels in each polygon. By referencing the RGB (red-green-blue) value for each pixel to the color bar, the numerical value for each pixel is determined and the average over each specified polygonal region is calculated (box 56, FIG. 13). In addition, the fractional area of each polygonal zone is also calculated. With the tool of FIG. 13, the required parameters input to the wind noise modeller can be determined accurately and objectively. In addition, the tool can be used to provide immediate information on the numerical value at the pointer tip. That is, the numerical value of the quantity is instantly displayed on-screen by clicking the mouse button anywhere on the color image. This tool can be used for any application in which quantitative information about a color image is desired at either selected points or over predetermined regions.

Figure 14:
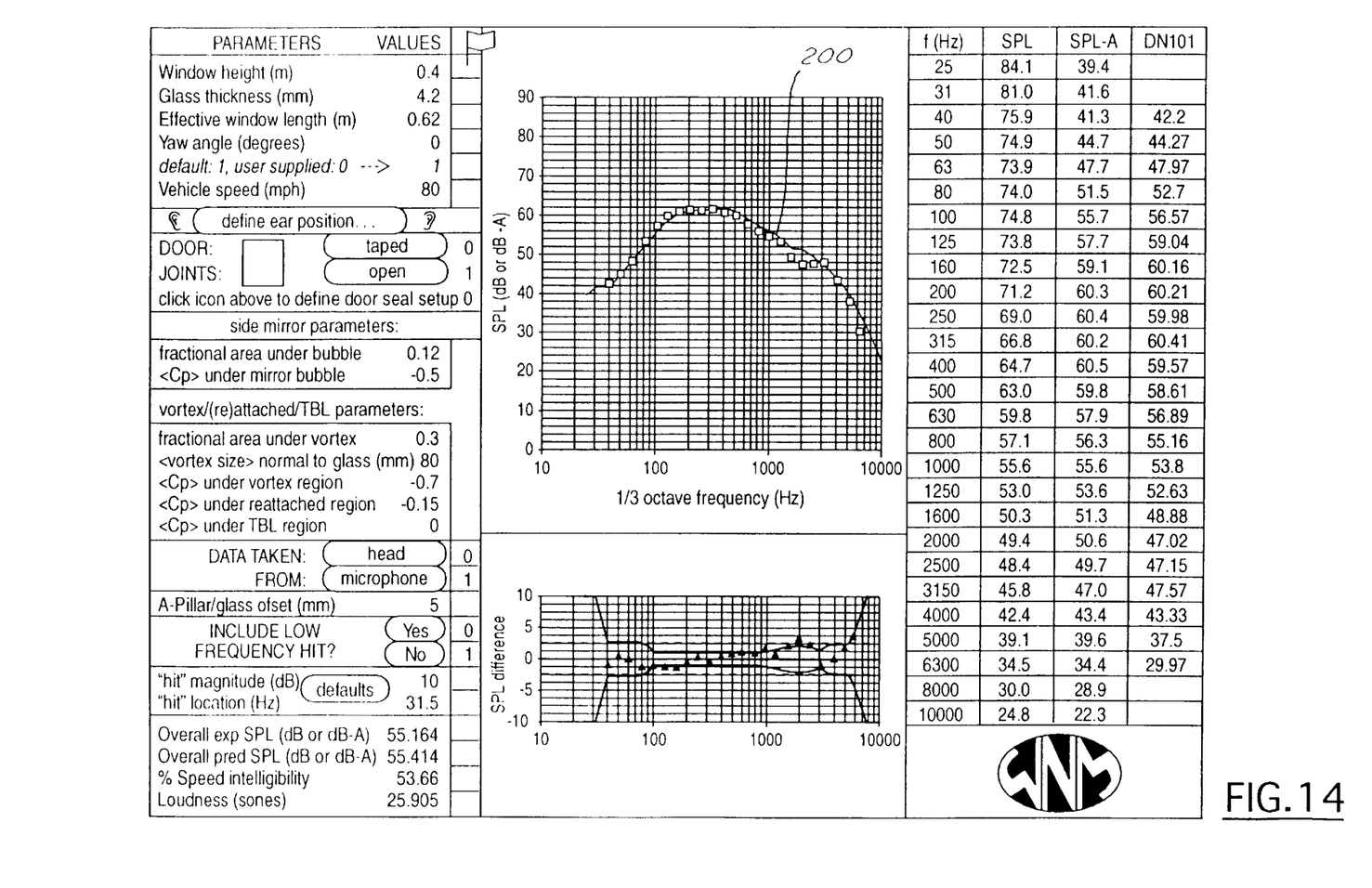
FIG. 14 is a screen view of a wind noise modeler program showing a calculated sound pressure level (SPL) for a vehicle design.
Figure 15:
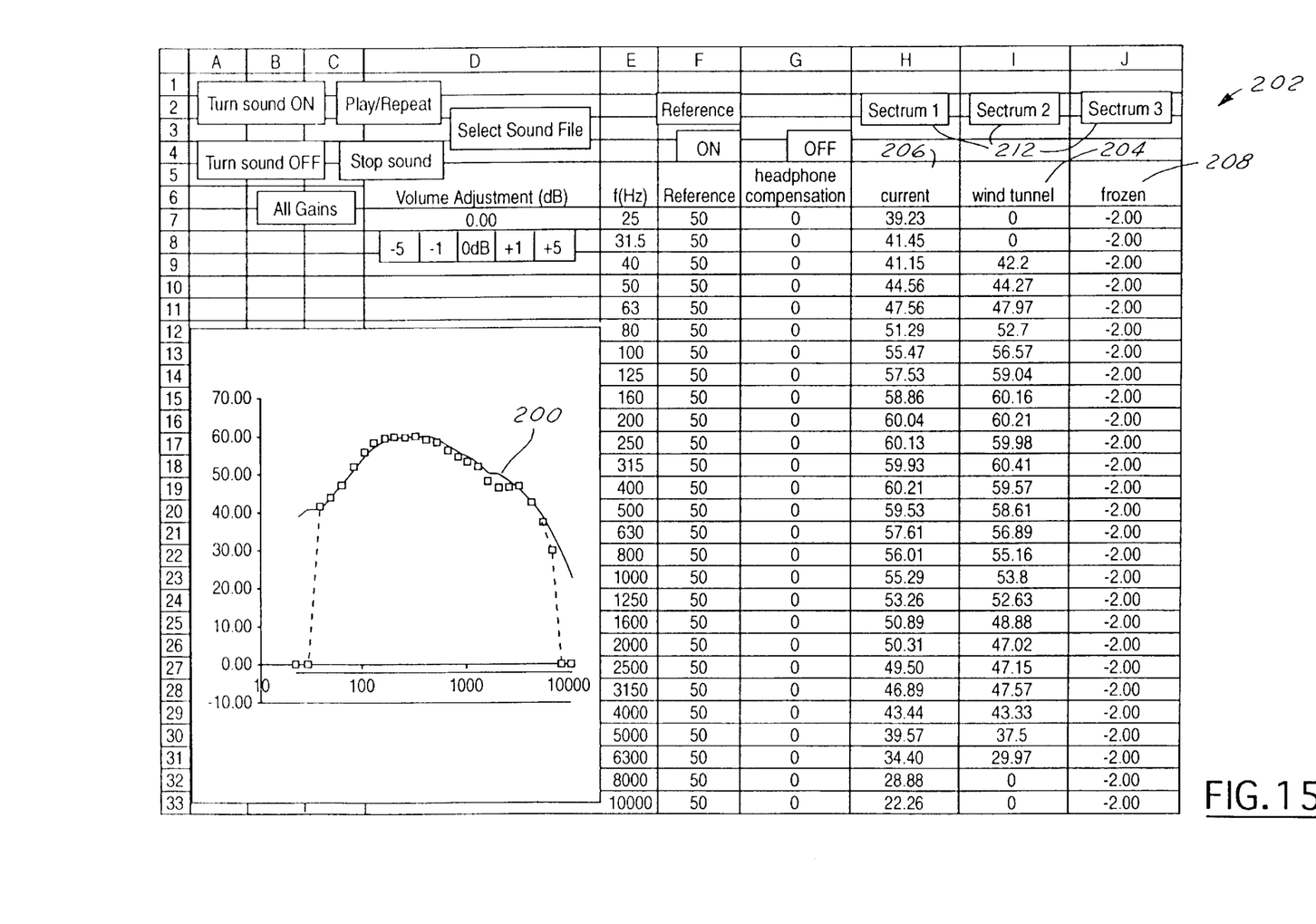
FIG. 15 is a screen view of an acoustics program.
Figure 16:
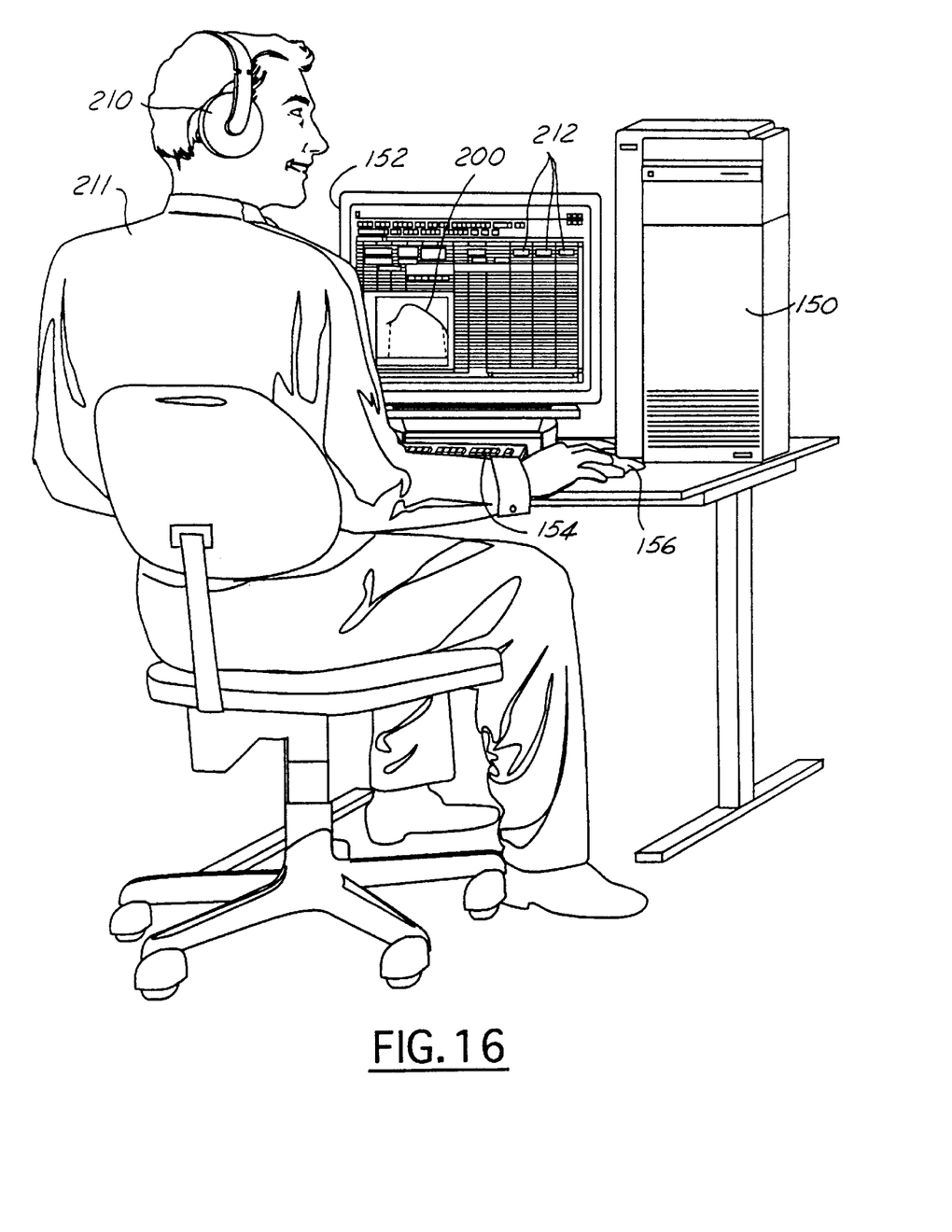
FIG. 16 is a perspective view of a system according to the present invention.

After the required parameters have been determined, the wind noise modeller takes the computed values from the application and computes a sound pressure level (SPL) 200 at the driver's ear (FIG. 14). This SPL 200 is dynamically linked to a virtual acoustics application, which preferably is a separate sheet 202 in a spreadsheet program (FIG. 15). The sheet 202 (FIG. 15) has a plot of the SPL 200 and a listing of three sound pressure spectra: experimental data 204, a desired design curve 206, and an alternate design curve 208. The program takes a white noise signal and "shapes it" to a selected of the three spectra, for example in the same fashion that a graphics equalizer shapes white noise. In this fashion, a "hissing noise" representing actual wind noise sounds in a vehicle can be acoustically played, for example through a set of speakers on a PC or through headphones 210 (FIG. 16). A user 211 (FIG. 16) can toggle between sounds by clicking on the buttons 212 over the individual spectra to permit immediately comparison between different vehicle designs to determine if the spectral difference between two designs can actually be heard. This is very important since the human ear cannot hear certain sound differences at certain frequencies. This capability provides the vehicle designer with a means to evaluate if a design change is necessary before actually building it.

A representative system for occupant based vehicle design according to the present invention is depicted in FIG. 16. The system includes a processing unit 150 connected to a user interface which may include a display terminal 152, a keyboard 154, a pointing device, such as a mouse 156, and the like. The processing unit 150 preferably includes a central processing unit, a memory, and stored instructions which implement a method for vehicle design according to the present invention. The stored instructions may be stored within the processing unit 150 in the memory, or in any non-volatile storage such as magnetic or optical media, EPROM, EEPROM, or the like. Alternatively, instructions may be loaded from removal magnetic media, such as a removal disk, sometimes called a floppy disk, optical media, or the like. In a preferred embodiment, the system includes a general purpose computer program to implement the functions illustrated and described above. Of course, a system according to the present invention could also be embodied with a dedicated device which includes various combinations of hardware and software. The preferred embodiment may also include a printer (not shown) connected to the processing unit 150, as well as a network connection for accessing a local server, an intranet, and the Internet.

The present invention thus provides a virtual aerodynamic/aeroacoustic wind tunnel. A CAD representation of a vehicle is used to render an aerodynamic evaluation quickly and efficiently on a desk workstation with a minimum amount of user intervention. This information can then be fed to a wind noise modeling program for a prediction of interior sound levels, which can then be played through speakers for an analysis of alternate vehicle designs.

Although the preferred embodiment of the present invention has been disclosed, various changes and modifications may be made without departing from the scope of the invention as set forth in the appended claims.

We claim:

1. A method for generating predicted wind noise within a passenger compartment of an automotive vehicle from a computer aided design (CAD) model representative of the vehicle without use of a wind tunnel, the method comprising the steps of:

preparing a CAD model of a desired portion of the vehicle;

creating a computational mesh of the desired portion of the vehicle design from the CAD model;

computing a transient flow over the desired portion using the computational mesh;

extracting a set of aerodynamic data from at least one predetermined area of the desired portion of the CAD model form the transient flow;

generating a virtual representation of wind noise at a predetermined location with respect to the CAD model based upon the set of aerodynamic data; and producing an acoustic representation of the virtual representation of wind noise by playing the virtual representation through at least one speaker.

2. The method of claim 1 wherein the set of aerodynamic data includes at least one of a set of vortex location and strength data, a set of exterior surface obstruction wake details data, and a set of pressure coefficient distribution data.

3. The method of claim 1 and further including the step of displaying the set of aerodynamic data in a predetermined format on a video display terminal to allow inspection and manipulation thereof.

4. The method of claim 1 wherein the step of generating a virtual representation of wind noise is accomplished by generating a set of predicted interior sound pressure levels with a wind noise modeling program and shaping a white noise sound file with the predicted sound pressure levels to represent the predicted wind noise.

5. The method of claim 1 wherein the step of preparing the CAD model includes modifying an initial CAD model to provide a completely closed solid representation thereof.

6. The method of claim 1 and further including the step of determining at least one of the set of aerodynamic data by regional electronic color estimation.

7. The method of claim 6 wherein the step of regional electronic color estimation is accomplished by:

obtaining a color image representing variation of the at least one set of aerodynamic data for a predetermined portion of the CAD model;

calibrating a color scale to correspond with the values of the at least one set of aerodynamic data;

sketching polygonal zones around selected areas of the predetermined portion of the CAD model; and computing electronically an average value for the selected area based on the color scale and the polygonal zones.

8. The method of claim 6 wherein the at least one of the set of aerodynamic data includes pressure coefficients.

9. A method for predicting automotive vehicle wind noise within a passenger compartment of a computer aided design (CAD) model of an automotive vehicle within a virtual wind tunnel, the method comprising the steps of:

storing a first set of data representing a CAD model of a desired portion of the vehicle in a computer memory;

storing a second set of data representing a computational mesh of the desired portion of the vehicle design in the memory based upon the first set of data;

computing a third set of data representing a transient flow over the desired portion using the second set of data;

extracting a fourth set of data form the third set of data representing aerodynamic data from at least one predetermined area of the desired portion of the CAD model;

generating a fifth set of data of a virtual representation of wind noise at a predetermined location with respect to the CAD model based upon the fourth set of data, the set of data generated using a set of predicted interior sound pressure levels with a wind noise modeling program and shaping a white noise file with the predicted sound pressure levels to represent the predicted wind noise; and producing an acoustic representation of the fifth set of data.

10. The method of claim 9 wherein the set of aerodynamic data includes at least one of a set of vortex location and strength data, a set of exterior surface obstruction wake details data, and a set of pressure coefficient distribution data.

11. The method of claim 9 and further including the step of displaying the fourth set of data in a predetermined format on a video display terminal to allow inspection and manipulation thereof.

12. The method of claim 9 wherein the step of producing an acoustic representation of the fifth set of data is accomplished by playing the virtual representation of wind noise through at least one speaker.

13. A virtual wind tunnel system for generating predicted wind noise within a passenger compartment of an automotive vehicle from a computer aided design (CAD) model representative of the vehicle, the system comprising:

CAD code means for preparing a CAD model of a desired portion of the vehicle;

mesh creation code means for creating a computational mesh of the desired portion of the vehicle design from the CAD model;

computational fluid dynamics code means for computing a transient flow over the desired portion using the computational mesh;

extraction code means for extracting a set of aerodynamic data from at least one predetermined area of the desired portion of the CAD model form the transient flow;

wind noise code means for generating a virtual representation of wind noise at a predetermined location with respect to the CAD model based upon the set of aerodynamic data; and sound generation means for producing an acoustic representation of the virtual representation of wind noise through at least one speaker, headphones, or other like device.

14. The system of claim 13 including refinement zone creation code means for allowing a user to interactively set a mesh for the CAD model.

15. The system of claim 13 including regional electronic color estimation code means for estimating a value of at least one of the set of aerodynamic data.

16. The method of claim 15 wherein the regional electronic color estimation code means comprises:

color image representation code means for representing variation of the at least one set of aerodynamic data for a predetermined portion of the CAD model;

calibration code means for calibrating a color scale to correspond with the values of the at least one set of aerodynamic data;

zone sketch code means for sketching polygonal zones around selected areas of the predetermined portion of the CAD model; and code means for computing an average value for the selected area based on the color scale and the polygonal zones.

17. The method of claim 1, wherein the step of producing an acoustic representation of the virtual representation of wind noise is accomplished by playing the virtual representation of wind noise through headphones instead of at least one speaker.

18. The method of claim 9, wherein the step of producing an acoustic representation of the fifth set of data is accomplished by playing the virtual representation of wind noise through at least one speaker, headphones, or other like device.

19. The system of claim 13, including code means for generating a set of predicted interior sound pressure levels with a wind noise modeling program, and code means for shaping a white noise sound file with the predicted sound pressure levels to represent the predicted noise.

* * * * *